United States Patent [19]

McJunkin

[11] Patent Number: 5,097,228
[45] Date of Patent: Mar. 17, 1992

[54] WIDEBAND OSCILLATOR WITH BIAS COMPENSATION

[75] Inventor: Barton L. McJunkin, Spokane, Wash.

[73] Assignee: Hewlett-Packard Company, Palo Alto, Calif.

[21] Appl. No.: 662,666

[22] Filed: Feb. 28, 1991

[51] Int. Cl.$^5$ ............... H03B 5/04; H03B 5/12; H03L 1/00; H03L 1/02
[52] U.S. Cl. ................. 331/176; 331/117 R; 331/177 V; 331/185
[58] Field of Search ............ 331/117 R, 176, 177 V, 331/185, 186

[56] References Cited

U.S. PATENT DOCUMENTS

| | | | |
|---|---|---|---|
| 3,360,746 | 12/1967 | Weidknecht | 331/176 |
| 3,388,344 | 6/1968 | West | 331/185 |
| 3,624,541 | 11/1971 | Lundstrom | 331/185 X |
| 4,015,218 | 3/1977 | Sanderson | 331/176 X |
| 4,146,850 | 3/1979 | Fache et al. | 331/117 R |

*Primary Examiner*—David Mis

[57] ABSTRACT

An RF oscillator is disclosed that can be tuned to operate over a wide range of frequencies while maintaining advantageous bias conditions. The oscillator includes circuitry that adjusts an oscillator bias signal in response to changes in oscillator frequency and/or ambient temperature, and does so without resort to using the same signal for both bias and frequency control. By so doing to control parameters such as phase noise, output power and compression angle, both the frequency range and temperature range of an oscillator can be extended, while simultaneously improving the oscillator's performance.

14 Claims, 5 Drawing Sheets

WIDEBAND OSCILLATOR WITH BIAS COMPENSATION

FIELD OF THE INVENTION

The present invention relates to oscillator circuits, and more particularly relates to oscillator circuits that can be tuned to operate over a wide range of frequencies while maintaining advantageous bias conditions.

BACKGROUND AND SUMMARY OF THE INVENTION

Wideband oscillators are well known in a variety of electronic arts and often include means to effect electronic tuning. That is, such oscillators often include a circuit element that can be controlled, by application of an electronic frequency control signal, to vary the oscillator's operating frequency.

There are a number of operational parameters that can be of concern in oscillator operation, depending on the oscillator's intended application. In oscillators intended for measurement instrumentation applications, for example, "phase noise" is often a critical parameter. Other parameters of concern may include output power and compression angle. Many of these parameters are strongly influenced by the bias conditions (such the voltage applied to a collector of an oscillator transistor) under which the oscillator is operated.

In an oscillator intended for fixed frequency operation, it is relatively straightforward to select the bias conditions so that the parameters of particular concern are optimized. However, a serious problem is evident in oscillators that can be tuned to operated over a broad band of frequencies: what bias conditions should be selected?

The usual approach is to select fixed, compromise bias conditions that permit adequate (rather than optimum) oscillator operation over a desired range of frequencies. By so doing, however, optimum oscillator performance is achieved at only one frequency, if at all. Further, the use of fixed bias conditions necessarily limits the range of possible operating frequencies, sometimes preventing certain design criteria from being met.

An alternative approach has been to try and design the oscillator circuit so that the optimum bias voltage changes, as a function of frequency, in exactly the same manner and magnitude as the frequency control signal changes as a function of frequency. In such cases, the same signal is used both for the frequency control signal and the bias signal. However, the fortuitous circumstances that permit such dual use of a single signal are quite rare, and the utility of this approach is thus quite limited.

Another approach sometimes used is to electronically change the configuration of the oscillator circuit as the tuning voltage is changed. This can be accomplished by means such as PIN diodes that switch certain circuit elements into or out of the circuit when predetermined tune voltage thresholds are passed. This approach, however, suffers by reason of its complexity and by reason of parasitic problems associated with the additional circuit elements.

The problem of achieving optimum oscillator bias is compounded by the fact that the optimum bias point changes with changes in temperature. An oscillator with fixed bias may thus fail to oscillate at certain frequencies if the ambient temperature is too high or low.

While compensation against changes in oscillator *frequency* due to temperature changes is known, no one has heretofore compensated against changes in optimum oscillator *bias* due to temperature changes.

While it might be proposed to extend the above-described "dual use of a single signal" compensation technique to encompass temperature compensation too, such an approach would be unavailing. Any adjustment to the oscillator bias to account for temperature effects would necessarily be accompanied by an unwanted change in the oscillator frequency.

In essence, then, wideband oscillators typically include compound compromises: compromises of oscillator bias as a function of frequency, and compromises of oscillator bias as a function of temperature. The result is an oscillator that performs poorly under most of its operating conditions.

In accordance with the present invention, these drawbacks of the prior art are addressed by circuitry that adjusts an oscillator's bias in response to changes in oscillator frequency and/or ambient temperature, and does so without resort to using the same signal for both bias and frequency control. By so doing, both the frequency range and temperature range of an oscillator can be extended, while simultaneously improving the oscillator's performance.

The foregoing and additional features and advantages of the present invention will be more readily apparent from the following detailed description, which proceeds with reference to the accompanying drawings.

DETAILED DESCRIPTION OF A PREFERRED EMBODIMENT

Figure 1:
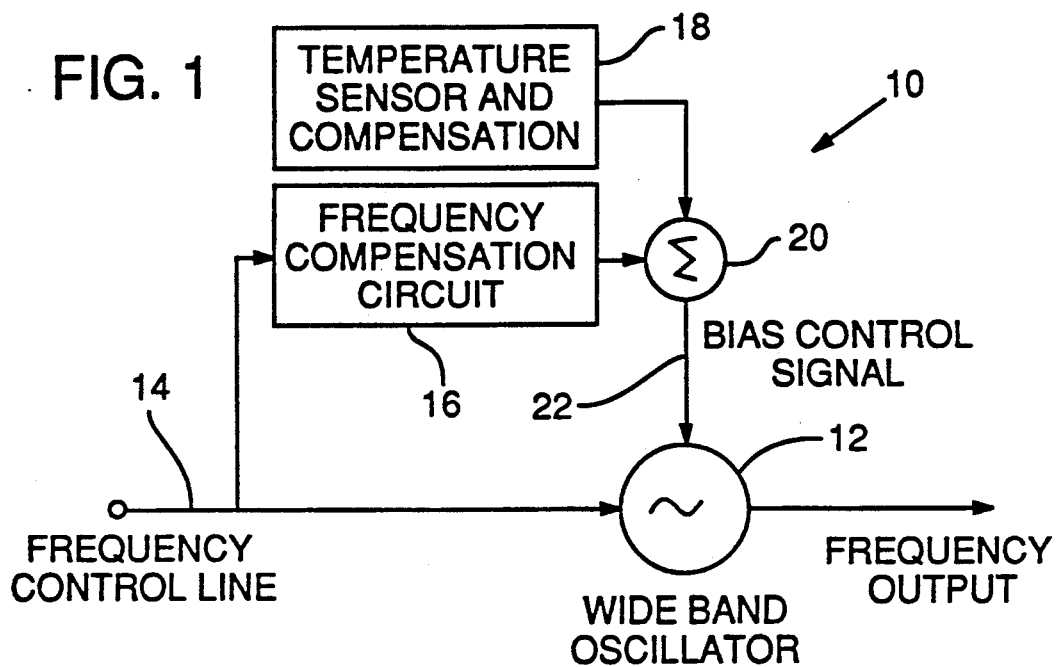
FIG. 1 is a block diagram of an oscillator according to an embodiment of the present invention.

Referring first to the simplified block diagram of FIG. 1, an oscillator system 10 according to one embodiment of the present invention includes an oscillator 12, a frequency control line 14, a frequency compensation circuit 16, a temperature sensor/compensation circuit 18, a combiner circuit 20, and a bias line 22.

The oscillator 12 may be conventional in arrangement and includes both an active device and a resonant circuit. The resonant circuit cooperates with the active device to provide a resonance at a desired oscillation frequency. In wideband oscillators, this resonant circuit includes a frequency control element that is responsive to a frequency control signal on the frequency control line 14 for varying the resonant frequency of the oscillator 12. The signal on the bias line 22 establishes the quiescent operating parameters of the oscillator's active device, such as the collector voltage if the device is a transistor.

The frequency compensation circuit 16 is coupled to the bias line 22 and including means for varying the bias signal applied to the active device in response to variations in the frequency control signal.

The temperature sensor/compensation circuit 18 is also coupled to the bias line 22 and includes means for varying the bias signal in response to variations in the ambient temperature.

The function of the foregoing compensation circuits 16, 18 will be made clearer from an examination of FIGS. 2A–2D, which show the range of possible bias voltages as a function of frequency for ambient temperatures of $-20°$ C., $10°$ C., $40°$ C. and $70°$ C., respectively.

Figure 2A:
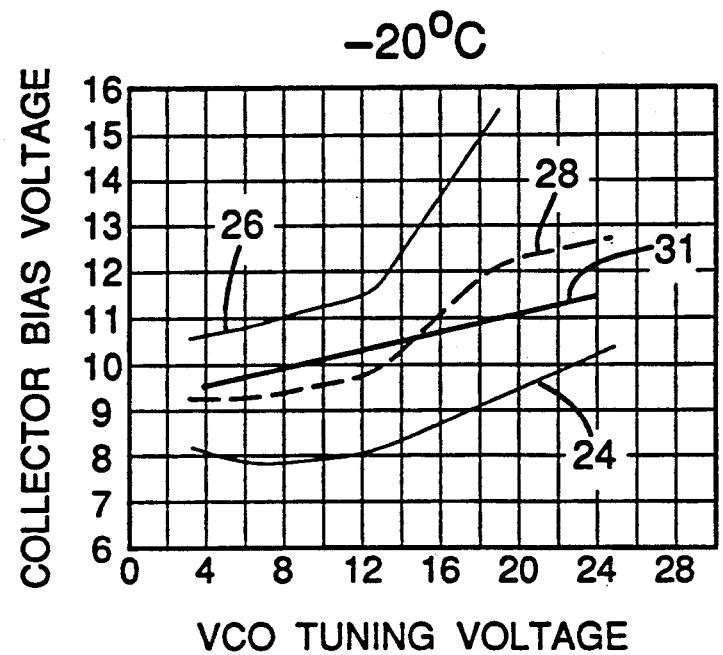
FIGS. 2A-2D are graphs showing illustrative relationships between tuning voltage and bias voltage for ambient temperatures of $-20°$ C., $10°$ C., $40°$ C. and $70°$ C.

Turning first to FIG. 2A, it will first be noted that the abscissa is scaled to correspond to VCO (Voltage Controlled Oscillator) TUNING VOLTAGE, rather than frequency. This is a matter of convenience rather than substance, since each voltage corresponds uniquely to an oscillator operating frequency. The voltage scale was chosen since it is the magnitude of this signal, rather than the frequency to which it corresponds, on which operation of the circuitry 10 depends. In the illustrated embodiments, a VCO TUNING VOLTAGE of 4 volts corresponds to an oscillator frequency of about 500 MHz, and a VCO TUNING VOLTAGE of 22 volts corresponds to an oscillator frequency of about 1.0 GHz. The depicted oscillator thus operates in the UHF frequency range (generally considered to be 300 MHz–3 GHz).

For each value of VCO TUNING VOLTAGE, FIG. 2A shows a range of corresponding bias voltages (denoted by the lower and upper solid curves 24, 26). The upper curve 26 indicates the maximum bias voltage before the output of the active device becomes unstable. The lower curve 24 indicates the collector voltage that produces an output signal power 10 dB below maximum—approximately where the oscillator ceases operation. The "optimum" operating point is somewhere between these two extremes.

By resort to theoretical exercises, including Leeson's Rule and Kurokowa's analysis of wideband oscillators, it can be shown that the optimum bias point for this wideband oscillator is just slightly below the upper curve 26. A similar result can be demonstrated empirically. However, the transition into the unstable operating region represented by the upper curve is abrupt and must be avoided. Consequently, the desired bias curve (the dashed curve 28 in FIG. 2A) is selected to be about one volt below curve 26, thereby providing an adequate safety margin over the expected range of circuit tolerances.

The problem then becomes one of varying the oscillator's bias voltage in a manner that approximates curve 28 as the VCO TUNING VOLTAGE is varied. This is the function of the frequency compensation circuit 16. The approximation of the desired bias curve 28 by the frequency compensation circuit 16 is the linear approximation curve labelled 31 in FIG. 2A.

Figure 2B:
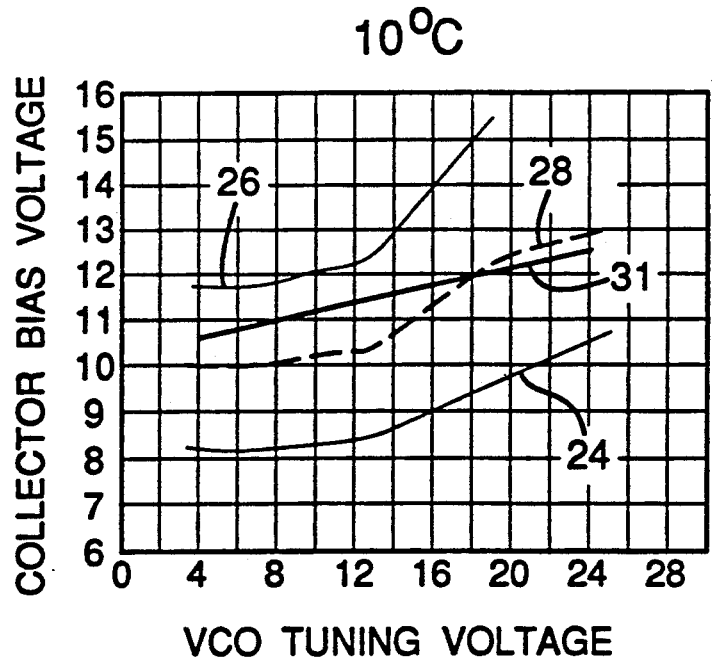
Figure 2C:
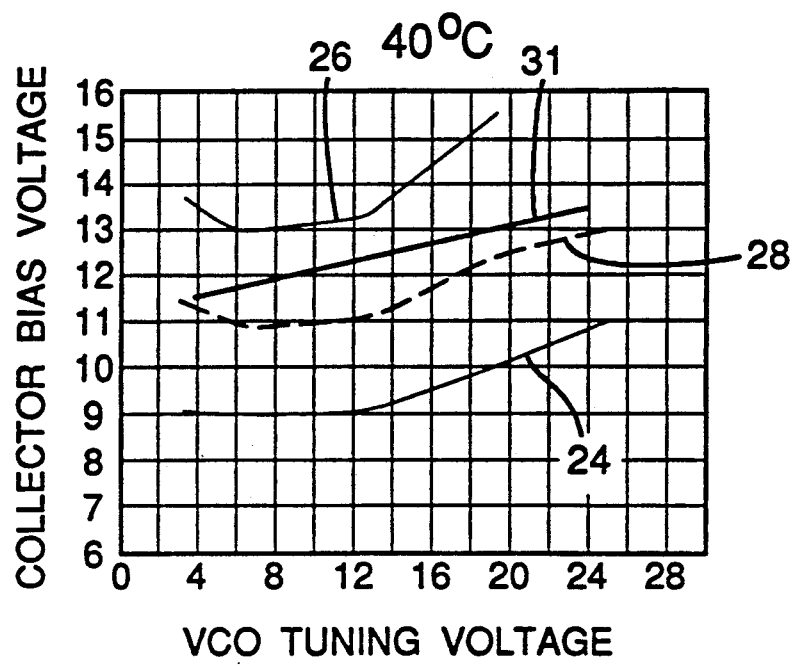
Figure 2D:
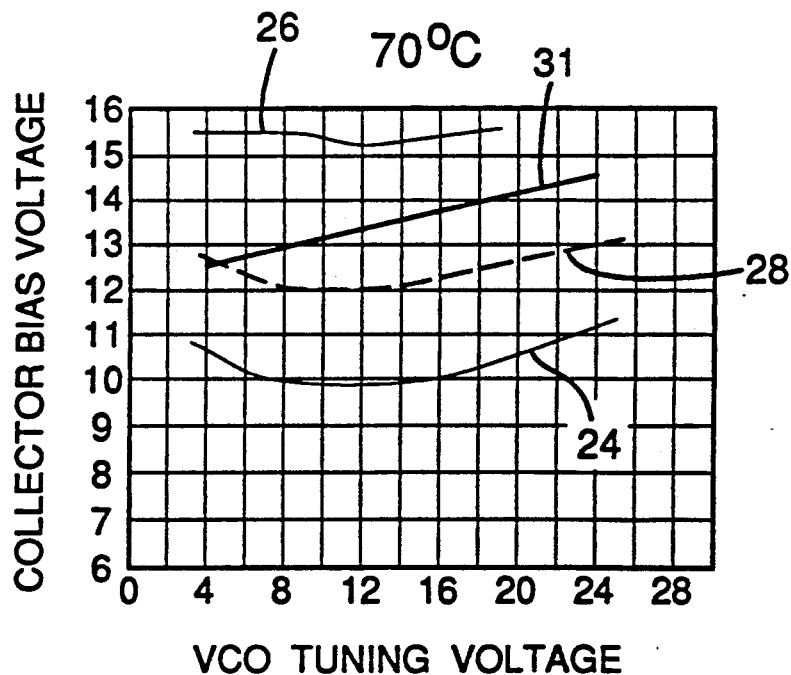

As noted, the oscillator's optimum bias point also varies with temperature. This is shown by FIGS. 2B–2D, which are identical to FIG. 2A except that they depict the optimum bias conditions at temperatures of $10°$ C., $40°$ C. and $70°$ C., respectively. While the linear approximation curve 31 of FIG. 2A ranges from 9.5 to 11.5 volts over the illustrated frequency (i.e. VCO TUNING VOLTAGE) span, the corresponding curve of FIG. 2B ranges from 10.5 to 12.5 volts—a difference of one volt. It will be seen that this same offset of $1V/30°$ C. holds true between FIG. 2B and FIG. 2C ($10°$ C. to $40°$ C.) and between FIG. 2C and 2D ($40°$ C. to $70°$ C). It is the function of the temperature sensor/compensation circuit 18 to effect this progressive offset in bias voltage as a function of temperature.

By inspection of FIGS. 2A–2D, the drawbacks of the prior art use of a fixed bias signal can readily be seen. No single bias value will permit this oscillator to operate for all tune voltages from 4 to 24 volts over the range of illustrated temperatures. Further, while a bias signal of 10.5 volts may permit oscillation over most of this range, the proximity of this value to the bottom curve 24 at higher tune voltages (aka frequencies) and at higher temperatures indicates a severe degradation in output power and phase noise under these conditions—degradation that is unacceptable in most oscillator applications.

Figure 3:
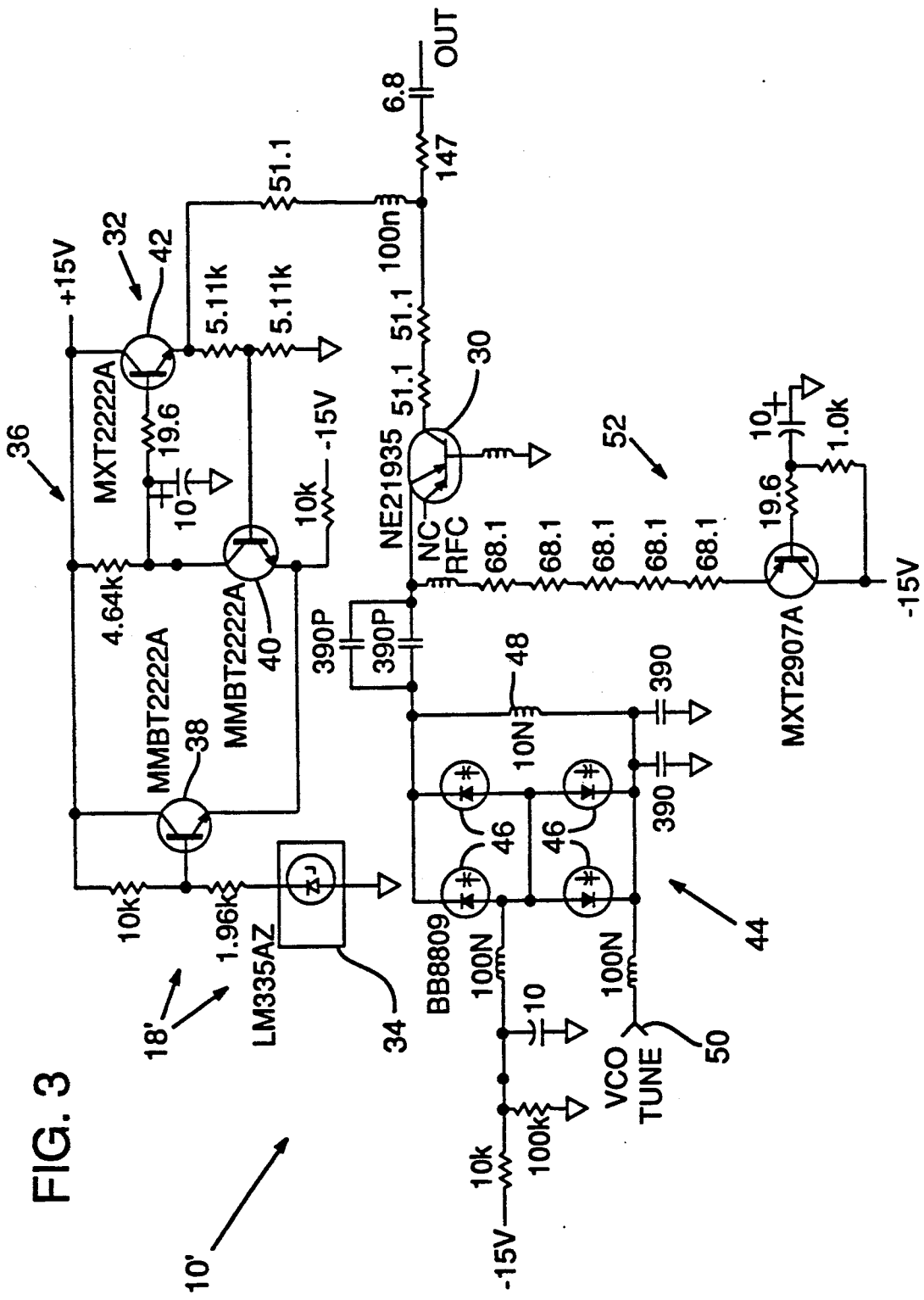
FIG. 3 is a schematic diagram of an oscillator employing a bias signal that is temperature compensated according to one embodiment of the present invention.

FIG. 3 is a detailed schematic of an oscillator 10' employing temperature compensation of bias voltage according to one embodiment of the present invention. As can be seen, oscillator 10' includes a bipolar transistor 0 as the active device. Coupled to transistor 30 is a collector bias circuit 32 that provides a bias voltage to the transistor's collector. The particular value of this bias voltage is set by a temperature sensor/compensation circuit 18' that includes a temperature sensor 34 and associated driver circuitry 36.

The temperature sensor 34 here comprises a temperature-sensing zener diode, such as an LM335 from National Semiconductor. This zener provides a voltage drop that increases ten millivolts with every ° K increase in temperature. At $10°$ C. the zener provides a voltage drop of 2.83 volts, at $40°$ C. it provides a voltage drop of 3.13 volts, etc.

The driver circuitry 36 associated with the temperature sensor 34 includes first and second transistors 38, 40. The temperature-dependent voltage drop produced across the zener diode 34 is used to control the current flow through the first transistor 38, which in turn establishes the emitter voltage on the second transistor 40. This latter voltage, in turn, controls the current through a bias control transistor 42 and thereby establishes the bias voltage applied to the collector of the oscillator transistor 30. Together, these three transistors 38, 40 and 42 produce a collector bias signal that increases about one volt for each $30°$ C. increase in ambient temperature.

Also shown in FIG. 3, although not here pertinent, is a resonator circuit 44 that controls the oscillator's frequency of oscillation. The resonator primarily comprises four varactor diodes 46 and a printed circuit inductor 48. The varactors present a shunt capacitance across the inductor that varies with a DC voltage applied to a VCO TUNE input 50. By changing the voltage applied to the VCO TUNE input 50, the resonant frequency of the LC circuit formed by inductor 48 and diodes 46 is changed. Also shown in FIG. 3 is an emitter bias circuit 52 that sets the DC emitter bias of the oscillator transistor 30.

Figure 4:
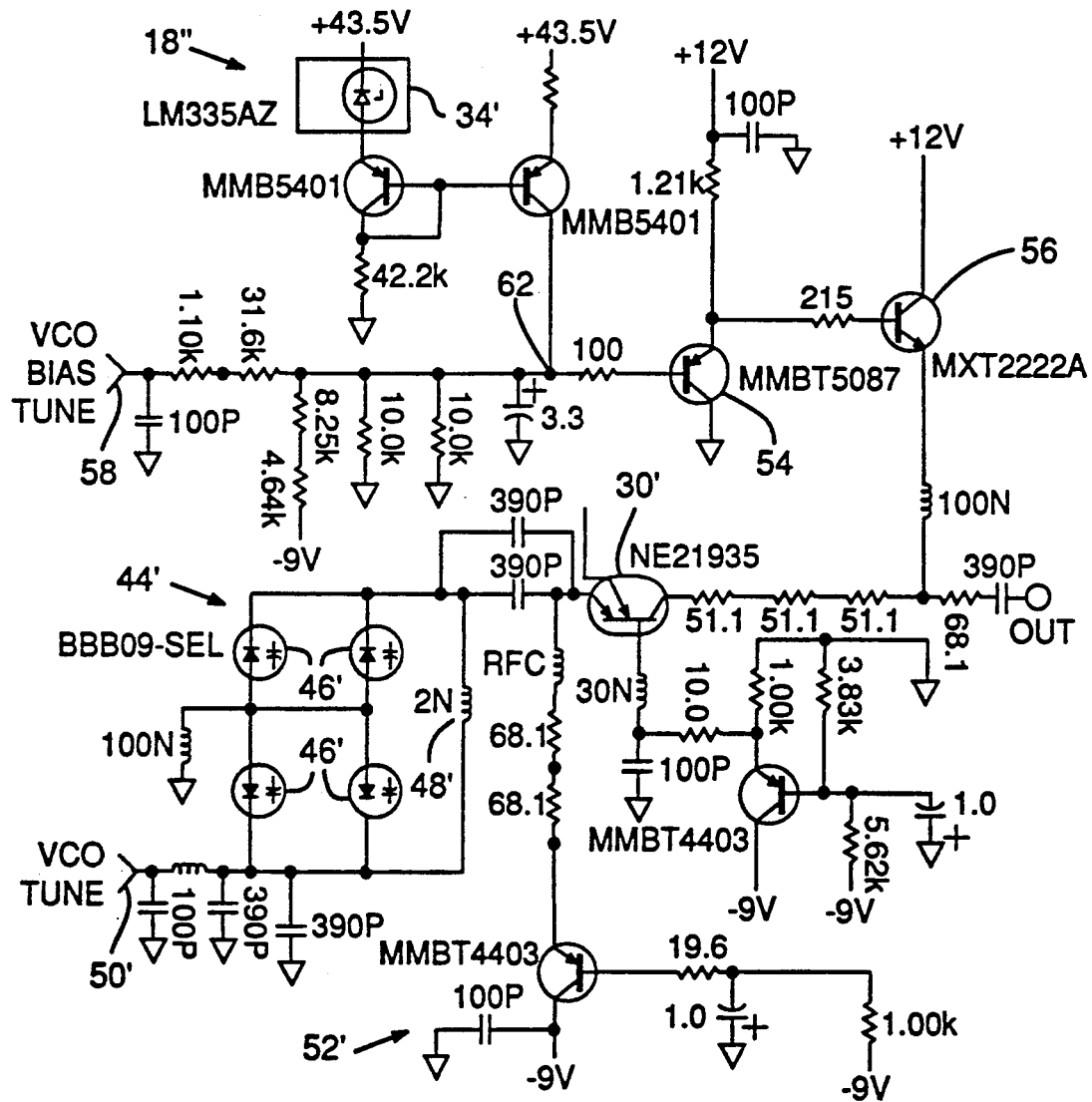
FIG. 4 is a schematic diagram of an oscillator employing a bias signal that is both temperature and frequency compensated according to another embodiment of the present invention.

FIG. 4 shows an oscillator 10" employing a bias signal that is compensated for both temperature and frequency in accordance with the present invention.

The oscillator 10" is similar in many respects to the oscillator 10' of FIG. 3. It includes, for example, an oscillator transistor 30', a temperature sensor/compensation circuit 18" (including a zener sensor 34'), a resonator 44' (including varactors 46' and a printed circuit inductor 48') and an emitter bias circuit 52'.

The collector bias circuit 32' is somewhat more elaborate in FIG. 4 than in FIG. 3 due to circuitry that combines the temperature compensation signal with the frequency compensation signal. Circuit 32' also includes two transistors 54, 56 to buffer the bias control signal present on the base of transistor 54 from beta variations inherent in the single transistor configuration.

As with FIG. 3, the temperature sensor/ compensation circuit 18" provides a temperature compensation signal to the collector bias circuit 32. The circuitry is arranged so that each 30° C. increase in ambient temperature results in a one volt increase in collector bias voltage.

The frequency compensation circuit 16' used in FIG. 4 is a network that biases transistor 54 to produce a linear increase in collector bias with increases in the VCO TUNE voltage. Like the oscillator represented by FIG. 2A, the network 16' here causes the collector bias voltage to increase linearly a total of two volts as the VCO TUNE VOLTAGE increases from 4 to 24 volts. A similar 2V/20V ratio holds in FIGS. 2B-2D.

Figure 5:
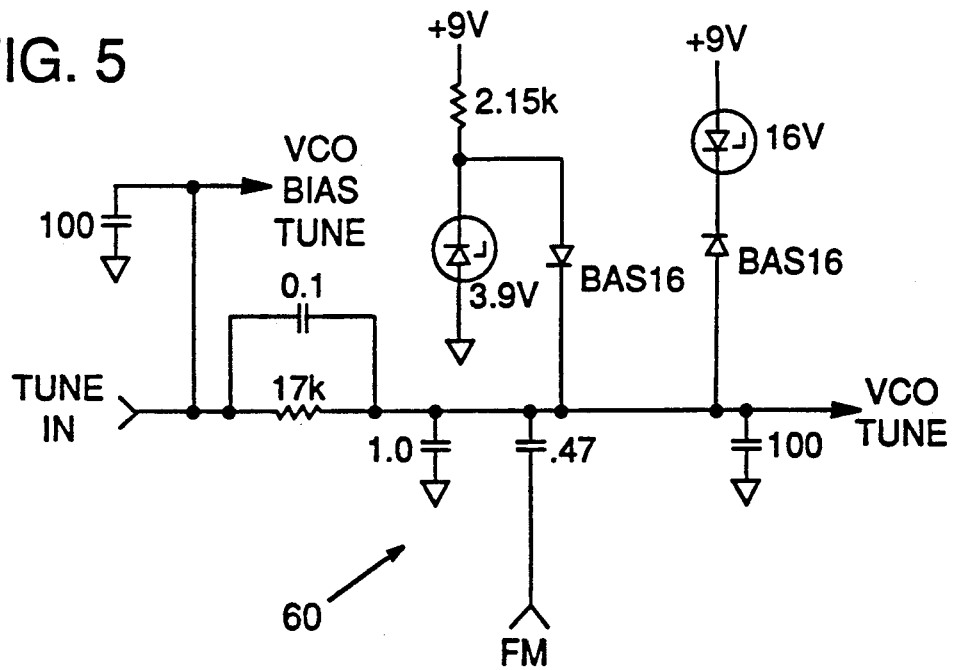
FIG. 5 is a schematic diagram of conditioning circuitry that provides the signals labelled VCO TUNE and VCO BIAS TUNE to the oscillator of FIG. 4.

It will be noted that the signal input to the frequency compensation circuit 16' at its input 58 is not actually the VCO TUNE voltage applied to the resonator 44 at its input 50'. Instead, a version of this signal, labelled VCO BIAS TUNE, is used. This signal has the same DC value as the VCO TUNE voltage but has undergone less filtering. The circuitry 60 that filters the VCO TUNE voltage (and permits its FM modulation) is shown in FIG. 5.

Filter circuitry 60 is employed because the noise requirements of the resonator tune voltage are much more stringent than the noise requirements of the compensation circuit tune voltage. Desirably, the compensation network 16' provides the same time constant characteristics to the bias control signal as the filtering circuitry 60 provides to the resonator tune voltage, so that both signals respond to tuning changes in tandem. (In simpler implementations, the same frequency control signal that is applied to the resonator varactors 46' at VCO TUNE voltage input 50' may also be applied to collector bias circuit 32' at VCO BIAS TUNE voltage input 58.)

The frequency and temperature compensation signals are combined at summing node 62 in FIG. 4. The oscillator's collector bias signal is thereby made a function of both temperature and frequency.

Having described and illustrated the principles of my invention with reference to two preferred embodiments thereof, it will be apparent that the invention can be modified in arrangement and detail without departing from such principles. For example, while the invention has been illustrated with reference to a bipolar transistor oscillator in which bias is set by control of the collector voltage, it will be recognized that other oscillator circuits may be used with other bias control signals. Similarly, while the invention has been illustrated with reference to variable frequency oscillators, it will be recognized that the temperature compensation aspects can be practiced equally well with fixed frequency oscillator designs.

While the invention has been illustrated with reference to an oscillator wherein a linear compensation model is used, it will be recognized that higher order compensation models can be employed if the application warrants. Similarly, while the invention has been described with reference to a UHF oscillator, it will be recognized that the principles of the invention can advantageously be applied to any radio frequency oscillator. (The invention is thought to be particularly advantageous with respect to oscillators operating above 30 MHz.) Finally, while the invention has been illustrated with reference to a purely analog implementation, it will be recognized that similar bias control techniques can be practiced using digital control systems.

In view of the wide variety of embodiments to which the principles of my invention may be applied, it should be apparent that the detailed embodiments are illustrative only and should not be taken as limiting the scope of my invention. Rather, I claim as my invention all such modifications as may come within the scope and spirit of the following claims and equivalents thereto.

I claim:

1. A method of operating an electronically tunable wideband oscillator that includes an active device, the oscillator being operable to produce an oscillator signal having a frequency above 30 MHz, the method comprising:
   applying a bias signal to the active device;
   receiving a parameter signal receiving to a parameter of oscillator operation; and
   varying the bias signal applied to the active device in response to the parameter signal;
   wherein the bias signal is automatically adjusted in response to the parameter to improve an oscillator signal characteristic other than oscillator frequency.

2. The method of claim 1 which includes changing the bias signal linearly with changes in the parameter signal.

3. The method of claim 1 wherein the parameter of oscillator operation is ambient temperature.

4. The method of claim 3 which includes varying a collector voltage of the active device in response to said parameter signal.

5. The method of claim 1 wherein the parameter of oscillator operation is the oscillator's frequency.

6. The method of claim 5 which includes varying a collector voltage of the active device in response to said parameter signal.

7. An oscillator comprising:
   an active device;
   a bias circuit coupled to the active device for applying a bias signal thereto;
   a resonant circuit coupled to the active device and cooperating therewith to provide a resonance at an oscillation frequency, said resonant circuit including a frequency control element that is responsive to a frequency control signal for varying the resonant frequency of said oscillator;
   an input for receiving a frequency control signal corresponding to a desired oscillation frequency and for applying said frequency control signal to the frequency control element; and
   a compensation circuit coupled to the bias circuit and including means for varying the bias signal applied to the active device in response to variations in the frequency control signal;
   wherein the bias signal and the frequency control signal are distinct signals.

8. The oscillator of claim 7 in which:
   the active device is a transistor having a collector; and the compensation circuit includes means for varying a voltage applied to the transistor collector in response to variations in the frequency control signal.

9. The oscillator of claim 7 which further includes a temperature compensation circuit coupled to the bias circuit, said temperature compensation circuit including a temperature responsive circuit element that causes the bias signal applied to the active device to vary in response to variations in ambient temperature.

10. The oscillator of claim 9 in which the temperature responsive circuit element includes a zener diode.

11. The oscillator of claim 7 in which the oscillator frequency is tunable above 30 MHz.

12. An oscillator comprising:
an active device;
a bias circuit coupled to the active device for applying a bias signal thereto;
a temperature sensor for providing an electrical signal related to an ambient temperature; and
a compensation circuit coupled to both the temperature sensor and the bias circuit and including means for adjusting the bias signal applied to the active device in response to variations in the ambient temperature to improve an oscillator signal characteristic other than frequency but without correcting a temperature induced shift of frequency.

13. The oscillator of claim 12 which further includes a resonator circuit that allows the oscillator to operate above 30 MHz.

14. The oscillator of claim 12 in which the temperature sensor comprises a zener diode.

* * * * *